(12) United States Patent
Kimura et al.

(10) Patent No.: US 6,207,345 B1
(45) Date of Patent: Mar. 27, 2001

(54) LAMINATE FILM AND PROCESSES FOR PREPARING PRINTED WIRING BOARD

(75) Inventors: Noriyo Kimura; Youji Tanaka; Kazutaka Masaoka, all of Hitachi; Takafumi Kudou, Sagamihara; Yukihiko Minamihira, Sagamihara; Tetsuo Yoshida, Sagamihara, all of (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/230,725

(22) PCT Filed: Jul. 30, 1997

(86) PCT No.: PCT/JP97/02640

§ 371 Date: Jan. 29, 1999

§ 102(e) Date: Jan. 29, 1999

(87) PCT Pub. No.: WO98/04407

PCT Pub. Date: Feb. 5, 1998

(30) Foreign Application Priority Data

Jul. 30, 1996 (JP) ................................................. 8-200197
Sep. 5, 1996 (JP) ................................................. 8-234592

(51) Int. Cl.[7] ..................................................... G03F 7/09
(52) U.S. Cl. ........................ 430/271.1; 430/311; 430/320
(58) Field of Search ............................... 430/271.1, 311, 430/320

(56) References Cited

U.S. PATENT DOCUMENTS 5,679,485 * 10/1997 Suzuki et al. ........................... 430/18
5,914,211 * 6/1999 Hashino et al. .................. 430/271.1
6,025,098 * 2/2000 Sakurai et al. ......................... 430/18

FOREIGN PATENT DOCUMENTS

| 5-323591 | 12/1993 | (JP) . |
| 6-181378 | 6/1994 | (JP) . |
| 8-36258 | 2/1996 | (JP) . |
| 8-179518 | 7/1996 | (JP) . |
| 9-90616 | 4/1997 | (JP) . |

* cited by examiner

*Primary Examiner*—Christopher G. Young
(74) *Attorney, Agent, or Firm*—Antonelli, Terry, Stout & Kraus, LLP

(57) ABSTRACT

Provided are a laminate film which comprises a photosensitive layer and a first film having a 5% elongation load in the longitudinal direction of the film per unit width at 80° C. of 4 to 90 g/mm and a breaking elongation in the longitudinal direction of the film per unit width of 50 to 1,000%, and processes for preparing a printed wiring board, which comprises laminating the laminate film on a substrate so that the photosensitive layer and the substrate are contacted with each other; and then subjecting a resulting material to exposure and development.

35 Claims, 1 Drawing Sheet

LAMINATE FILM AND PROCESSES FOR PREPARING PRINTED WIRING BOARD

TECHNICAL FIELD

This invention relates to a laminate film and processes for preparing a printed wiring board, more specifically, to a laminated film in which a transfer layer is favorably conformed to the surface unevenness of a target on which the transfer layer is to be laminated, resolution can be improved and the production yield of a printed wiring board can be greatly improved without increasing production costs and processes for preparing a printed wiring board.

BACKGROUND ART

A laminate film 1 to be used for forming a resist film for plating or etching, when a printed wiring board is prepared, is constituted by coating a photosensitive resin composition on a support (base) layer (a base film) 2', followed by drying, to form a photosensitive layer 3, and laminating a coating (covering) layer (a protective film) 4' on the photosensitive layer 3 as shown in FIG. 2(a). In the prior art, the support layer 2' and the photosensitive layer 3 form a transfer layer 5', and the transfer layer 5' is laminated on a substrate 6 of a printed wiring board, on which the transfer layer 5' is to be laminated.

When the conventional laminate film 1 is to be laminated, after peeling (stripping) the coating layer 4', the transfer layer 5' is superposed on the substrate 6 so that the photosensitive layer 3 faces toward the side of the substrate 6, and then the transfer layer 5' is pressurized from the side of the support layer 2' by using a heating roll to effect contact bonding. Therefore, a sectional view after lamination is as shown in FIG. 2(b).

Next, a negative mask (phototool) is placed on the support layer 2', and the photosensitive layer 3 is exposed by irradiation with light for exposure through the negative mask. Thereafter, the negative mask is removed, the support layer 2' ispeeled (stripped) off, and then the photosensitive layer 3 is developed to obtain the photosensitive layer 3 having the same pattern as that of the above negative mask. By using the photosensitive layer 3 left on the substrate as a resist film, a next plating or etching step is carried out.

As the support layer 2', a film (e.g., a film of polyethylene terephthalate (PET)) having a 5 % elongation load in the longitudinal direction of the film per unit width at 80° C. of 100 g/mm or more is used, and the thickness of the film is generally about 20 μm. In order to heighten the tensile strength of the laminate film 1, the support layer 2' is required to have such a thickness, and it is also necessary to increase the hardness of the support layer 2' to a certain extent.

The photosensitive layer 3 is formed from a photosensitive resin composition in which the physical properties of an irradiated portion are changed when UV ray or the like is irradiated, and a suitable composition is selected depending on the purpose of use. The thickness of the photosensitive layer 3 is set to be, for example, 25 μm, 33 μm, 40 μm or 50 μm depending on the purpose. As the coating layer 4', a film of polyethylene or the like is used, and the thickness of the film is, for example, 30 μm.

When the transfer layer 5' is laminated, it should be conformed to the unevenness of a base material so that a non-adhered portion between the photosensitive layer 3 and the base material does not exist.

In recent years, the density of wiring (line and space) of a printed wiring board has been heightened, and high resolution has been demanded. In order to heighten the resolution of the laminate film 1, it is effective to make the photosensitive layer 3 thinner. However, the amount of the photosensitive layer which is conformed to the surface unevenness of a base material is reduced so that in the conventional laminate film 1, a non-adhered portion between the substrate 6 and the transfer layer 5' is enlarged to cause a problem that sufficient production yield cannot be obtained. Also, in the conventional laminate film, the flexibility of the entire transfer layer 5' is made insufficient due to the above thickness and hardness necessary for the support layer 2', and the transfer layer 5' is difficultly conformed to the surface unevenness of a base material on which the transfer layer 5' is to be laminated. As a result, a non-adhered portion between the substrate 6 and the transfer layer 5' is enlarged to cause a problem that sufficient production yield cannot be obtained.

Various means to cope with the problems as described above have been proposed. For example, a method of coating water on a base material and then laminating a laminate film on the base material has been described (see Japanese Provisional Patent Publications No. 21890/1982 and No. 21891/1982).

In this method, in order to adhere a thin water layer to the base material uniformly, the surface of the base material should be cleaned. When through holes with a small size or the like exist in the base material, water held in the through holes and a photosensitive layer are easily reacted to involve drawbacks that developability is lowered and so on.

Also, a method of laminating a laminate film on a base material after forming an adhesive intermediate layer by laminating a liquid resin on the base material has been proposed (see Japanese Provisional Patent Publication No. 154363/1977).

In this method, there are drawbacks that the developability, peeling property (stripping property) and so on of through holes with a small size are lowered, cost is increased by coating the liquid resin, and so on.

Also, a method of laminating a laminate film under reduced pressure by using a vacuum laminator has been known (see Japanese Patent Publication No.31670/1978 and Japanese Provisional Patent Publication No. 63702/1976).

In this method, an apparatus is expensive, and evacuation takes time. Therefore, the method is not used frequently for forming a common circuit and is utilized only as a laminate of a permanent mask to be used after formation of a conductor. Also, in such lamination of a permanent mask (solder mask), further improvement of conformability to a conductor has been demanded.

An object of the first invention is to provide a laminate film in which a transfer layer is favorably conformed to the surface unevenness of a target on which the transfer layer is to be laminated, resolution can be improved and the production yield of a printed wiring board can be greatly improved without increasing production costs.

An object of the second invention is to provide a laminate film having improved sensitivity, crosslinking density, storage stability and resolution and good peeling (stripping) property of a first film from a photosensitive layer in addition to the effects of the first invention.

An object of the third invention is to provide a laminate film having excellent handling property in addition to the effects of the first and the second invention.

An object of the fourth invention is to provide a laminate film having improved operatability at the time of lamination in addition to the effects of the third invention.

An object of the fifth and the sixth inventions are to provide processes for preparing a printed wiring board, in which a transfer layer is favorably conformed to the surface unevenness of a target on which the transfer layer is to be laminated, resolution can be improved and the production yield of a printed wiring board can be greatly improved without increasing production costs.

DISCLOSURE OF THE INVENTION

The present invention relates to a laminate film which comprises a photosensitive layer and a first film having a 5% elongation load in the longitudinal direction of the film per unit width at 80° C. of 4 to 90 g/mm and a breaking elongation in the longitudinal direction of the film per unit width of 50 to 1,000%.

Also, the present invention relates to the above-mentioned laminate film, wherein the first film has an oxygen permeation amount of 400 ml/m$^2$·24h·atm or less, a water absorption rate of 5% or less and a haze of 10% or less.

Also, the present invention relates to the above-mentioned laminate film, wherein said laminate film comprises the photosensitive layer, the first film and further a second film at a side opposite to the side of the photosensitive layer where the first film is provided.

Also, the present invention relates to the above-mentioned laminate film, wherein the adhesive force between the second film and the photosensitive layer is smaller than the adhesive force between the first film and the photo-sensitive layer.

Also, the present invention relates to a process for preparing a printed wiring board, which comprises laminating the above-mentioned laminate film on a substrate so that the photosensitive layer and the substrate are contacted with each other, and then, subjecting a resulting material to exposure and development.

Also, the present invention relates to a process for preparing a printed wiring board, which comprises peeling (stripping) the second film from the above-mentioned laminate film, laminating the laminate film on a substrate so that the photosensitive layer and the substrate are contacted with each other, and then, subjecting a resulting material to exposure and development.

BEST MODE FOR PRACTICING THE INVENTION

Figure 1:
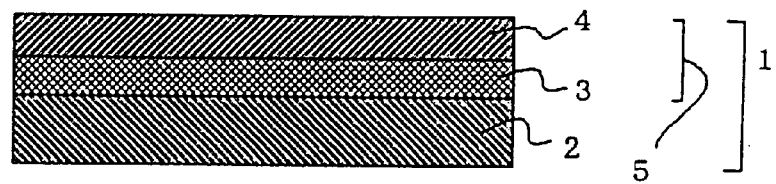
FIG. 1(a) and FIG. 1(b) are schematic views showing one example of a state that a laminate film 1 is laminated on a substrate 6 in the process for preparing a printed wiring board of the present invention.
Figure 1:
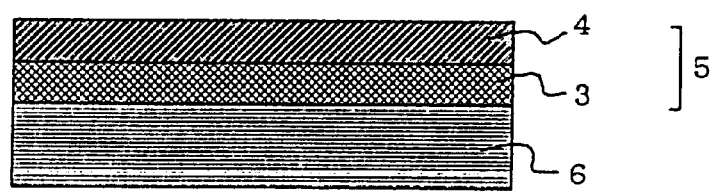
Figure 2:
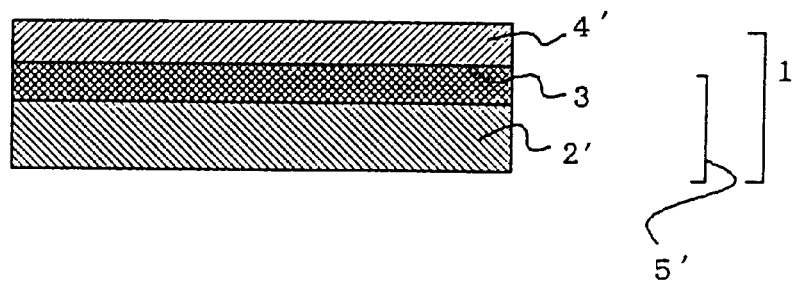
FIG. 2(a) and FIG. 2(b) are schematic views showing one example of a state that a laminate film 1 is laminated on a substrate 6 in a conventional process for preparing a printed wiring board.
Figure 2:
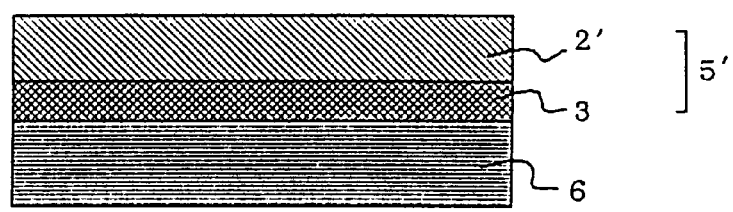

The laminate film of the present invention has a photosensitive layer and a first film having a 5 % elongation load (which is a value in the longitudinal direction of the film, hereinafter referred to as "the L5 value") per unit width at 80° C. of 4 to 90 g/mm and a breaking elongation (which is a value in the longitudinal direction of the film, hereinafter the same) per unit width at 80° C. of 50 to 1,000%.

As the photosensitive layer in the present invention, a known photosensitive resin composition can be used. In order that the photosensitive resin composition can be developed with a dilute alkaline aqueous solution, it generally contains a carboxyl group-containing binder polymer, a photopolymerization initiator and a photo-polymerizable vinyl compound as essential components.

With respect to the carboxyl group-containing binder polymer to be used in the present invention, those having a weight average molecular weight measured by gel permeation chromatography (GPC) using standard polystyrene of 10,000 to 500,000 are preferred. When alkaline development is carried out, as the above binder polymer, those having an acid value of solid component of 30 to 300 are preferred.

As the above-mentioned carboxyl group-containing binder polymer, there may be mentioned, for example, copolymers of alkyl acrylate or alkyl methacrylate, acrylic acid or methacrylic acid and a vinyl monomer which is copolymerizable with these monomers, or the like. These copolymers may be used singly or in combination of two or more of them.

As the alkyl acrylate, there may be mentioned, for example, methyl acrylate, ethyl acrylate, butyl acrylate, 2-ethylhexyl acrylate and methacrylates corresponding to these acrylates.

As the copolymerizable vinyl monomer, there may be mentioned, for example, tetrahydrofurfuryl acrylate, dimethylaminoethyl acrylate, diethylaminoethyl acrylate, glycidyl acrylate, 2,2,2-trifluoroethyl acrylate, 2,2,3,3-tetrafluoropropyl acrylate, methacrylates corresponding to these acrylates, acrylamide, methacrylamide, diacetonacrylamide, diacetonmethacrylamide, styrene, vinyltoluene, or the like.

As the photopolymerization initiator, there may be mentioned, for example, aromatic ketones (benzophenone, N,N'-tetramethyl-4,4'-diaminobenzophenone (a Michler's ketone), N,N'-tetraethyl-4,4'-diaminobenzophenone, 4-methoxy-4'-dimethylaminobenzophenone, 2-ethylanthraquinone, phenanthrenequinone, etc.), benzoin ethers (benzoinmethyl ether, benzoinethyl ether, benzoinphenyl ether, etc.), benzoins (methylbenzoin, ethylbenzoin, etc.), benzil derivatives (benzilmethylketal, etc.), 2,4,5-triarylimidazole dimers (2-(o-chlorophenyl)-4,5-diphenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer, 2-(p-methylmercaptophenyl)-4,5-diphenylimidazole dimer, etc.) and acridine derivatives (9-phenylacridine, 1,7-bis(9,9'-acridinyl)heptane, etc.). These compounds may be used singly or in combination of two or more of them.

As the photopolymerizable vinyl compound, there may be mentioned, for example, urethane acrylates such as urethane acrylate Biscoat #831 (trade name, produced by Osaka Yuki Kagaku Kogyo Co.), polyether type urethane acrylate BTG-A (trade name, produced by Kyoeisha Yushi Kagaku Kogyo Co.), polyester type urethane acrylate D-200A (trade name, produced by Kyoeisha Yushi Kagaku Kogyo Co.), urethane acrylate Photomer 6008 (trade name, produced by Sannopuko Co.) and urethane diacrylate Chemlink 9503 (trade name, produced by Sertomer Co.) or the like, a compound obtained by reacting an α,β-unsaturated carboxylic acid with a polyvalent alcohol such as trimethylolpropane ethoxy triacrylate (SR-454, trade name, produced by Sertomer Co.), trimethylolpropane propoxy triacrylate (R-924, trade name, produced by Nippon Kayaku Co.), polyethylene glycol diacrylate (having 2 to 23 ethylene groups), trimethylolpropane diacrylate, trimethylolpropane triacrylate, tetramethylolmethane triacrylate, tetramethylolmethane tetraacrylate, polypropylene glycol diacrylate (having 2 to 14 propylene groups), dipentaerythritol pentaacrylate, dipentaerythritol hexaacrylate and methacrylates corresponding to these acrylates, a bisphenol A dioxyethylene diacrylate such as bisphenol A dioxyethylene diacrylate, bisphenol A trioxyethylene diacrylate, bisphenol A decaoxyethylene diacrylate, etc., a compound obtained by adding an α,β-unsaturated carboxylic acid to a glycidyl group-containing compound such as trimethylolpropane triglycidyl ether triacrylate, bisphenol A diglycidyl ether acrylate and methacrylates corresponding to these acrylates, an esterified compound which is a reaction product of a polyvalent carboxylic acid such as phthalic anhydride, etc., and a compound having a hydroxyl group and an ethylenic unsaturated group such as 2-hydroxyethyl acrylate, 2-hydroxyethyl methacrylate, etc., alkyl esters of acrylic acid or methacrylic acid such as methyl acrylate, ethyl acrylate, butyl acrylate, 2-ethylhexyl acrylate, methacrylates corresponding to these acrylates, etc. These compounds may be used singly or in combination of two or more of them.

Into the photosensitive resin composition to be used for the photosensitive layer in the present invention, a plasticizer, a dye, a pigment, an imaging agent, a filler, an adhesiveness-imparting agent, etc., may be formulated, if necessary. The thickness of the photosensitive layer may vary depending on the use, but the thickness after drying is preferably about 3 to 100 μm, more preferably about 10 to 100 μm.

The fluidity of the photosensitive layer is preferably 50 to 500 μm, more preferably 100 to 300 μm, particularly preferably 100 to 250 μm from the points of conformability to a material to be coated such as a substrate, low deformation property, low edge fusion property, etc., of the photosensitive layer. The fluidity of the photosensitive layer may be adjusted to the above range by regulating the kinds and formulation amounts of the respective components constituting the photosensitive layer. The fluidity herein mentioned refers to a value $T_1-T_2$ (μm) obtained by using a photosensitive layer having a diameter of 20 mm and a thickness of 2 mm as a sample; placing this sample on a flat substrate; applying a static load of 5 kg with a cylindrical shape having a diameter of 50 mm; and measuring a thickness ($T_1$ μm) after 10 seconds and a thickness ($T_2$ μm) after 900 seconds of the sample which is being deformed.

The L5 value of the first film in the present invention is required to be 4 to 90 g/mm, preferably 8 to 90 g/mm, more preferably 8 to 60 g/mm, particularly preferably 8 to 30 g/mm.

The reason for setting the L5 value to be 4 to 90 g/mm is that if it is less than 4 g/mm, inconvenience of elongating the transfer layer at the time of lamination to reduce film thickness is caused, while if it exceeds 90 g/mm, inconvenience of lowering the conformability of the photosensitive layer to the surface unevenness of a target to be laminated is caused.

The breaking elongation of the first film in the present invention is required to be 50 to 1,000%, preferably 100 to 1,000%, more preferably 100 to 800%, particularly preferably 150 to 600%, extremely preferably 150 to 400%.

The reason for setting the breaking elongation to be 50 to 1,000% is that if it is less than 50%, inconvenience of lowering the conformability of the photosensitive layer to the surface unevenness of a target to be laminated is caused, while it exceeds 1,000%, inconvenience of elongating the transfer layer at the time of lamination to reduce film thickness is caused.

Also, the oxygen permeation amount of the first film in the present invention is preferably 400 ml/m$^2$·24h·atm or less, more preferably 0 to 200 ml/m$^2$·24h·atm, particularly preferably 0 to 100 ml/m$^2$·24h·atm.

If the oxygen permeation amount exceeds 400 ml/m$^2$·24h·atm, the photosensitive layer suffers from inhibition by oxygen so that problems of lowering in sensitivity at the time of exposure, lowering in the crosslinking density of a cured resist film and so on tend to be caused.

The water absorption rate of the first film in the present invention is preferably 5% or less, more preferably 0 to 1%, particularly preferably 0 to 0.5%.

If the water absorption rate exceeds 5%, the adhesive force between the photosensitive layer and the coating layer is increased so that it is difficult to peel (strip) the coating layer before development, and also the storage stability of the laminate film tends to be lowered.

Also, the haze of the first film in the present invention is preferably 10% or less, more preferably 0 to 6%, particularly preferably 0 to 4%, extremely preferably 0 to 2%.

If the haze exceeds 10%, the permeation rate (transmissivity) of light for exposure is reduced, and simultaneously, the refraction and scattering of the light for exposure are increased so that resolution tends to be significantly worsened.

Also, in the first film of the present invention, the Elemendorf tear strength thereof is preferably 4.5 kg/cm or more, more preferably 5 kg/cm or more, particularly preferably 7 kg/cm or more. If the Elemendorf tear strength is less than 4.5 kg/cm, the covering layer tends to be easily broken in the step of peeling (stripping) the covering layer from the photosensitive layer.

Also, in the first film of the present invention, both of the refractive index (Nx: longitudinal direction) and the refractive index (Ny: lateral direction) are preferably 1.55 or more, more preferably 1.60 or more, particularly preferably 1.65 or more. If the refractive indexes are less than 1.55, property of correcting oblique light incident at the time of exposure toward a perpendicular direction is lowered so that resolution tends to be worsened.

The first film in the present invention is preferably, for example, a film of the material such as a homopolymer polyester, a copolymer polyester, a blend polyester (a blend of homopolymer polyesters, a blend of a homopolymer polyester and a copolymer polyester, a blend of copolymer polyesters, etc.), or the like; a non-stretched polypropylene film or a biaxially stretched polypropylene film on which a gas barrier layer (e.g., polyvinylidene chloride coating, etc.) is provided, or the like.

This is because these films satisfy the above-mentioned characteristics and also have an excellent balance in heat resistance and moisture resistance as compared with a non-stretched polyethylene film, a non-stretched polyamide film or the like. If heat resistance is low, a film is easily melted due to temperature at the time of lamination, and if hygroscopicity is high, the adhesive force between the photosensitive layer and the first film is increased so that peeling (stripping) of the first film before development is liable to be difficult.

The thickness of the first film in the present invention is preferably 2 to 30 μm, more preferably 5 to 20 μm, particularly preferably 8 to 14 μm. If the thickness is less than 2 μm, inconvenience of elongating the transfer layer at the time of lamination tends to be caused. If it exceeds 30 μm, the refraction and scattering of the light for exposure are easily increased so that resolution tends to be lowered, and conformability to the surface unevenness of a target on which the transfer layer is to be laminated tends to be lowered.

The laminate film of the present invention can be prepared by, for example, coating the above-mentioned photosensitive resin composition on the above-mentioned first film, followed by drying.

Also, in the laminate film of the present invention, it is preferred that it has a second film at a side opposite to the side of the photosensitive layer where the first film is provided, in addition to the photosensitive layer and the first film described above, from the point of excellent handling property.

The laminate film of the present invention using such a second film can be prepared by, for example, coating the above-mentioned photosensitive resin composition on the second film, followed by drying, to form a photosensitive layer and laminating the first film on the photosensitive layer.

The first film in the present invention is relatively soft so that it is preferred to use a relatively tough second film and to coat the above-mentioned photosensitive resin composition on such a second film and dried, from the point that a uniform photosensitive layer can be formed.

Also, in this case, the adhesive force between the second film and the photosensitive layer is preferably smaller than the adhesive force between the first film and the photosensitive layer since the transfer layer can be easily formed by peeling (stripping) the second film.

The adhesive force (A1) between the second film and the photosensitive layer in the present invention is preferably 10 g/cm or less in terms of 180° peeling (stripping) strength. If the adhesive force (A1) is too large, peeling (stripping) of the second film tends not to be carried out smoothly.

Also, the adhesive force (A2) between the first film and the photosensitive layer is not particularly limited so long as it is larger than the adhesive force (A1) in terms of 180° peeling strength.

The second film in the present invention is peeled (stripped) off before lamination. Therefore, the second film is not particularly limited so long as it has flexibility, can be adhered to the photosensitive layer so that it is peelable (strippable) therefrom, and is not damaged by the temperature of a drying furnace. As the second film, there may be mentioned, for example, a paper, a release paper and a film of a polyester such as polyethylene terephthalate, a polyolefin such as polymethylpentene, polypropylene and polyethylene, a halogen-containing vinyl polymer such as polyvinyl fluoride and polyvinyl chloride, a polyamide such as nylon, a cellulose such as cellophane, a polystyrene, and the like. These materials may be transparent or opaque, and may be subjected to release treatment.

The thickness of the second film in the present invention is not particularly limited. However, when the size of the laminated film wound in a roll state is considered, the thickness of the second film is preferably 5 to 200 μm. more preferably 10 to 100 μm, particularly preferably 10 to 50 μm.

The laminate film of the present invention obtained as described above can be wound in a roll state for storage.

Also, the laminate film of the present invention may have intermediate layers or protective layers such as a cushion layer, an adhesive layer, a light-absorbing layer and a gas barrier layer, in addition to the photosensitive layer, the first film, and the second film which may be used, if necessary.

The process for preparing a printed wiring board of the present invention comprises laminating the laminate film having the photosensitive layer and the first film described above on a substrate so that the photosensitive layer and the substrate are contacted with each other; and then subjecting a resulting material to exposure and development.

Also, the process for preparing a printed wiring board of the present invention comprises peeling (stripping) the second film from the laminate film having the photosensitive layer, the first film and the second film described above, laminating the laminate film on a substrate so that the photosensitive layer and the substrate are contacted with each other; and then subjecting a resulting material to exposure and development.

In the following, one example of the process for preparing a printed wiring board of the present invention is explained in detail by using FIG. 1(a) and FIG. 1(b).

FIGS. 1(a) and (b) are schematic views showing a state that a laminate film 1 is laminated on a substrate 6 in the process for preparing a printed wiring board of the present invention. In FIGS. 1(a) and (b), the laminate film 1 has a photosensitive layer 3, a first film 4 and a second film 2, and the photosensitive layer 3 and the first film 4 form a transfer layer 5.

As the substrate 6 in the present invention, there may be mentioned, for example, a sheet of a metal such as copper, iron, aluminum, etc., a sheet of an alloy such as stainless, 42 alloy (Fe—Ni alloy), etc., and a copper-clad laminated board.

FIG. 1(a) is a schematic view of the laminate film 1 of the present invention comprising the transfer layer 5 having the photosensitive layer 3 and the first film 4, and the second film 2. FIG. 1(b) is a schematic view showing a state that the second film 2 of the laminate film 1 is peeled (stripped) off, and the transfer layer 5 is laminated on the substrate 6.

A method of laminating the laminate film 1 on the substrate 6 is not particularly limited and may include, for example, a method of using a laminator equipped with a roll which can be heated. In general, at the time of lamination, the temperature is 60 to 150° C. (preferably 80 to 130° C.), the pressure is 1 to 10 kgf/cm$^2$ (preferably 3 to 7 kgf/cm$^2$), and the feed rate (feed speed) is 0.1 to 10 m/min (preferably 1 to 5 m/min).

The exposure method in the present invention is not particularly limited and may include, for example, a method in which a negative mask having a predetermined pattern is superposed on the first film 4 (on the photosensitive layer 3 when the first film is peeled (stripped) off) and irradiation with active light is carried out from a portion above the negative mask by using a light source such as an ultra-high pressure mercury lamp, and a method of carrying out irradiation with active light in a pattern state by CAD (Computer-aided design) using a laser.

The development in the present invention is to develop the photosensitive layer 3 to remove a portion (an unnecessary portion) other than a portion to be a resist pattern of the photosensitive layer 3.

A developing method is not particularly limited and may include, for example, a wet developing method utilizing difference in solubility in a developing solution between an exposed portion and an unexposed portion of the photosensitive layer 3, which are generated by exposure, and a dry developing method utilizing difference in adhesive force between the exposed portion and the unexposed portion.

From the point of resolution, the wet developing method is preferred. The developing solution to be used in the wet developing method is not particularly limited and may be mentioned, for example, an organic solvent such as 1,1,1-trichloroethane, or an alkaline solution such as a sodium carbonate aqueous solution. In the wet developing method, the above developing solution is brought into contact with the photosensitive layer 3 after exposure, and either the exposed portion or the unexposed portion is removed by dissolution or peeling (stripping).

After development, a resist pattern is formed on the substrate. Thereafter, according to a conventional method, the substrate is subjected to etching or plating, and then the resist pattern is peeled (stripped) off from the substrate to obtain the printed wiring board in the present invention.

EXAMPLES

The present invention is explained in detail by referring to Examples.

Preparation example 1
(Preparation of Photosensitive layer material (I))
Materials shown in Table 1 were formulated to prepare Photosensitive layer material (I).

TABLE 1

| Material | Formulation amount |
| --- | --- |
| Copolymer of methacrylic acid/methyl methacrylate (25/75 (weight ratio)), weight average molecular weight: 75,000 | 60 parts by weight |
| Tetrapropylene glycol diacrylate | 40 parts by weight |
| Diethylaminobenzophenone | 0.2 part by weight |
| Benzophenone | 5 parts by weight |
| Crystal Violet | 0.03 part by weight |
| Methyl ethyl ketone | 100 parts by weight |

Preparation example 2
(Preparation of Photosensitive layer material (II))

Materials shown in Table 2 were formulated to prepare Photosensitive layer material (II).

TABLE 2

| Material | Formulation amount |
| --- | --- |
| 40% by weight methyl cellosolve/toluene (6/4 (weight ratio)) solution (acid value of solid component: 144) of a copolymer of methacrylic acid/methyl methacrylate/ethyl acrylate/ethyl methacrylate (22/45/27/6 (weight ratio)), weight average molecular weight: 75,000 | 150 parts by weight (solid component: 60 parts by weight) |
| 2,2'-Bis((4-methacryloxypenta-ethoxy)phenyl)propane | 30 parts by weight |
| γ-Chloro-β-hydroxypropyl-β'-meth-acryloyloxyethyl-o-phthalate | 10 parts by weight |
| 1,7-Bis(9,9'-acridinyl)heptane | 0.4 part by weight |
| N,N'-tetraethyl-4,4'-diamino-benzophenone | 0.05 part by weight |

TABLE 2-continued

| Material | Formulation amount |
| --- | --- |
| Leuco-Crystal Violet | 0.5 part by weight |
| Malachite Green | 0.05 part by weight |
| Tribromomethylphenylsulfone | 1 part by weight |
| Acetone | 10 parts by weight |
| Toluene | 10 parts by weight |
| Methanol | 3 parts by weight |

Example 1
(Preparation of Laminate film A)

As a second film, a biaxially stretched polyethylene terephthalate film (produced by Teijin Co., trade name: $S_{71}$) having a thickness of 25 μm which was subjected to a release treatment was used. On said film, Photosensitive layer material (I) obtained in Preparation example 1 was coated so as to have a thickness after drying of 40 μm, followed by hot air drying at 80° C. for 10 minutes, to prepare a photosensitive layer.

Then, as a first film, a biaxially stretched isophthalic acid-copolymerized polyethylene terephthalate film (produced by Teijin Co., HK-4 (a film sample) (L5 value: 55 g/mm (a value obtained by fitting a thermostatic chamber to a Tensilon universal tensile tester, carrying out a tensile test of a strip-shaped sample having a width of 10 mm at 80° C. with a distance between chucks of 10 cm and a tensile rate of 10 cm/min and dividing a load when the sample was elongated by 5% by the width of the sample was defined as a L5 value (g/mm). Hereinafter the same), breaking elongation: 150% (measured according to JIS C 2318. Hereinafter the same), oxygen permeation amount: 170 ml/m$^2$·24h·atm (measured according to JIS Z 1707. Hereinafter the same), water absorption rate: 0.3% (measured according to JIS K 7209. Hereinafter the same), haze: 4% (measured according to JIS K 6782. Hereinafter the same), Elemendorf tear strength: 7.5 kg/cm (measured according to JIS P 7128 method B. Hereinafter the same), refractive indexes Nx: 1.64, Ny: 1.64 (measured according to JIS K 7105. Hereinafter the same)) having a thickness of 11 μm was used. Said film was coated on the above photosensitive layer to prepare Laminate film A. Laminate film A obtained was wound up so that the first film faced outward.

Example 2
(Preparation of Laminate film B)

Laminate film B was prepared in the same manner as in Example 1 except for using a biaxially stretched polypropylene film (produced by Futamura Kagaku Kogyo Co., trade name: FOR-12) having a thickness of 12 μm on which polyvinylidene chloride was coated as a gas barrier layer so as to have a thickness of 3 μm (L5 value: 25 g/mm, breaking elongation: 200%, oxygen permeation amount: 10 ml/m$^2$·24h·atm, water absorption rate: 0.3%, haze: 3%, Elemendorf tear strength: 1.8 kg/cm, refractive indexes Nx: 1.60, Ny: 1.60) in place of the film sample HK-4 used as a first film. Laminate film B obtained was wound up so that the first film faced outward.

Example 3
(Preparation of Laminate film C)

As a second film, a biaxially stretched polypropylene film (produced by Shin-etsu Film Co., trade name: PT30) having a thickness of 30 μm was used. On said film, Photosensitive layer material (II) obtained in Preparation example 2 was coated so as to have a thickness after drying of 40 μm, followed by hot air drying at 80° C. for 10 minutes, to prepare a photosensitive layer.

Then, as a first film, the film sample HK-4 used in Example 1 was used, and this was coated on the above photosensitive layer to prepare Laminate film C. Laminate film C obtained was wound up so that the first film faced outward.

Example 4
(Preparation of Laminate film D)

Laminate film D was prepared in the same manner as in Example 3 except for using a biaxially stretched blend film of isophthalic acid-copolymerized polyethylene terephthalate and polybutylene terephthalate (produced by Teijin Co., HK-7 (a film sample), L5 value: 20 g/mm, breaking elongation: 180%, oxygen permeation amount: 130 ml/m$^2$·24h·atm, water absorption rate: 0.3%, haze: 2.9%, Elemendorf tear strength: 7.6 kg/cm, refractive indexes Nx: 1.63, Ny: 1.64) having a thickness of 11 μm in place of the film sample HK-4 used as a first film. Laminate film D obtained was wound up so that the first film faced outward.

Example 5
(Preparation of Laminate film E)

Laminate film E was prepared in the same manner as in Example 3 except for using a biaxially stretched polyethylene terephthalate film (produced by Teijin Co., HK-7 (a film sample), L5 value: 85 g/mm, breaking elongation: 110%, oxygen permeation amount: 130 ml/m2·24h·atm, water absorption rate: 0.3%, haze: 1.5%, Elemendorf tear strength: 4.0 kg/cm, refractive indexes Nx: 1.65, Ny: 1.66) having a thickness of 11 μm in place of the film sample HK-4 used as a first film. Laminate film E obtained was wound up so that the first film faced outward.

HK-4 used as a first film. Laminate film F obtained was wound up so that the first film faced outward.

Comparative example 1
(Preparation of Laminate film G)

On a biaxially stretched polyethylene terephthalate film (produced by Teijin Co., trade name: G2-19, L5 value: 150 g/mm, breaking elongation: 150%, oxygen permeation amount: 90 ml/m$^2$·24h·atm, water absorption rate: 0.3%, haze: 1.5%, Elemendorf tear strength: 6.0 kg/cm, refractive indexes Nx: 1.65, Ny: 1.66) having a thickness of 19 μm, Photosensitive layer material (I) obtained in Preparation example 1 was coated so as to have a thickness after drying of 40 μm. followed by hot air drying at 80° C. for 10 minutes, to prepare a photosensitive layer.

Then, a non-stretched polyethylene film (produced by Tamapoli Co., trade name: NF-13) having a thickness of 25 μm was coated on the above photosensitive layer to prepare Laminate film G. Laminate film G obtained was wound up so that the film of G2-19 faced outward.

Comparative example 2
(Preparation of Laminate film H)

Laminate film H was prepared in the same manner as in Comparative example 1 except for using Photosensitive layer material (II) in place of Photosensitive layer material (I) as in Comparative example 1. Laminate film H obtained was wound up so that the G2-19 film faced outward.

Details of the laminate films obtained are summarized in Table 3.

TABLE 3

| | | Example | | | | | | Comparative Example | |
|---|---|---|---|---|---|---|---|---|---|
| | | 1 | 2 | 3 | 4 | 5 | 6 | 1 | 2 |
| Laminate film | | A | B | C | D | E | F | G | H |
| Photosensitive layer material | | (I) | (I) | (II) | (II) | (II) | (II) | (I) | (II) |
| First film | Trade name or sample name | HK-4 | FOR-12 with gas barrier layer | HK-4 | HK-7 | HK-1 | FOR-12 | G2-19 | |
| | L5 value | 55 | 25 | 55 | 20 | 85 | 18 | 150 | |
| | Breaking extension | 150 | 200 | 150 | 180 | 110 | 140 | 150 | |
| | Oxygen permeation amount | 170 | 10 | 170 | 130 | 130 | 1400 | 90 | |
| | Water absorption rate | 0.3 | 0.3 | 0.3 | 0.3 | 0.3 | 0.3 | 0.3 | |
| | Haze | 4 | 3 | 4 | 2.9 | 1.5 | 2.5 | 1.5 | |
| | Elmendorf tear strength | 7.5 | 1.8 | 7.5 | 7.6 | 4.0 | 1.2 | 6.0 | |
| | Refractive (Nx) | 1.64 | 1.60 | 1.64 | 1.63 | 1.65 | 1.50 | 1.65 | |
| | Index (Ny) | 1.64 | 1.60 | 1.64 | 1.64 | 1.66 | 1.49 | 1.66 | |
| Second film | Trade name or sample name | $S_{71}$ | $S_{71}$ | PT30 | PT30 | PT30 | PT30 | NF-13 | |

Example 6
(Preparation of Laminate film F)

Laminate film F was prepared in the same manner as in Example 3 except for using a biaxially stretched propylene film (produced by Futamura Kagaku Kogyo Co., trade name: FOR-12, L5 value: 18 g/mm, breaking elongation: 140%, oxygen permeation amount: 1,400 ml/m$^2$·24h·atm, water absorption rate: 0.3%, haze: 2.5%, Elemendorf tear strength: 1.2 kg/cm, refractive indexes Nx: 1.50, Ny: 1.49) having a thickness of 12 μm in place of the film sample Examples 7 to 12 and Comparative example 3 and 4
(Preparation of Printed wiring boards a)

The copper surfaces of glass epoxy substrates (produced by Hitachi Chemical Co., Ltd., trade name: MCL-E67-35S) on which a copper foil having a thickness of 35 μm was laminated were polished by using a polishing machine (manufactured by Sankei Co., Japan) having a brush corresponding to #600, washed with water and dried by air stream to obtain copper-clad laminated boards.

Then, the copper-clad laminated boards obtained were heated to 80° C. By using a high temperature laminator (manufactured by Hitachi Chemical Co., Ltd., HLM-3000), Laminate film A, Laminate film B, Laminate film C, Laminate film D, Laminate film E, Laminate film F, Laminate film G and Laminate film H prepared in Examples 1 to 6 and Comparative examples 1 and 2 were laminated on the above substrates, respectively, so that the photosensitive layers of all laminate films faced toward the substrates; the first film sides of Laminate film A, Laminate film B, Laminate film C, Laminate film D, Laminate film E and Laminate film F touched a lamination roll of the laminator; and the G2-19 film sides of Laminate film G and Laminate film H touched the lamination roll.

The lamination rate (lamination speed) at this time was 1.5 m/min, the temperature of the lamination roll was 100° C., and the cylinder pressure of the lamination roll was 4 kgf/cm$^2$.

Then, after completion of lamination, the resulting materials were cooled to 23° C. On the first films of the materials using Laminate film A, Laminate film B, Laminate film C, Laminate film D, Laminate film E and Laminate film F and on the G2-19 films of the materials using Laminate film G and Laminate film H, a negative mask (a negative mask having a wiring pattern in which line/space was 400/20 to 400/200 (resolution, unit: $\mu$m) and a Stofer 21 grade step tablet) was closely contacted, respectively, and exposure was carried out by using an exposure machine (model: HMW-590, a mercury short arc lamp) manufactured by Orc Seisakusho Co. in such an energy amount that the number of remaining step grades of the Stofer 21 grade step tablet after development became 8.0.

Then, the first films of the materials using Laminate film A, Laminate film B, Laminate film C, Laminate film D, Laminate film E and Laminate film F and the G2-19 films of the materials using Laminate film G and Laminate film H were removed. The resulting materials were subjected to spray development by using a 1% by weight sodium carbonate aqueous solution (30° C.) for 50 seconds to obtain resist patterns on the substrates. The values of the minimum space widths where there was no undeveloped portion of the resist patterns obtained were measured as resolution. The results are shown in Table 4. When this value is smaller, resolution is more excellent.

Then, a cupric chloride (copper (II) chloride) etching solution (2 mole/liter CuCl$_2$, a 2N—HCl aqueous solution, 50° C., spray pressure: 2 kgf/cm$^2$) was sprayed to the respective materials for 100 seconds to dissolve copper at the portions which were not protected by the resists. Further, the resist patterns were peeled (stripped) off by using a peeling (stripping) solution (a 3% by weight NaOH aqueous solution, 45° C., spray pressure: 2 kgf/cm$^2$) to prepare Printed wiring boards a in which copper lines were formed on the substrates.

(Preparation of Printed wiring boards b)

On the surfaces of copper foils on glass epoxy substrates (produced by Hitachi Chemical Co., Ltd., trade name: MCL-E67-70S) wherein a copper foil having a thickness of 70 $\mu$m was each laminated thereon, scratches having a length of 10 cm and a width of 1 to 40 $\mu$m were formed so that the depth of the scratches was gradually deepened (1 to 20 $\mu$m) every scratch, whereby copper-clad laminated boards on which plural scratches were formed were obtained. These scratches were formed by changing the load of a continuous weight-loading type scratching apparatus (manufactured by HEIDON Co., Japan).

Then, the copper-clad laminated boards obtained were heated to 80° C. By using a high temperature laminator (HLM-3000 manufactured by Hitachi Chemical Co., Ltd. was used), Laminate film A, Laminate film B, Laminate film C, Laminate film D, Laminate film E, Laminate film F, Laminate film G and Laminate film H prepared in Examples 1 to 6 and Comparative examples 1 and 2 were laminated on the above substrates, respectively, so that the photosensitive layers of all laminate films faced toward the substrates; the first film sides of Laminate film A, Laminate film B, Laminate film C, Laminate film D, Laminate film E and Laminate film F touched a lamination roll of the laminator; and the G2-19 film sides of Laminate film G and Laminate film H touched the lamination roll (the axis of the lamination roll was made parallel to the longitudinal direction of the scratches of the substrates). The lamination rate (lamination speed) at this time was 2 m/min, the temperature of the lamination roll was 100° C., and the cylinder pressure of the lamination roll was 4 kgf/cm$^2$.

Then, after completion of lamination, the resulting materials were cooled to 23° C. On the first films of the materials using Laminate film A, Laminate film B, Laminate film C, Laminate film D, Laminate film E and Laminate film F and on the G2-19 films of the materials using Laminate film G and Laminate film H, a negative mask forming a negative image with a line width of 200 $\mu$m and a Stofer 21 grade step tablet were placed in a direction crossing perpendicularly to the longitudinal direction of the scratches of the substrates, respectively, and exposure was carried out by using a high pressure mercury lamp in such an energy amount that the number of remaining step grades of the Stofer 21 grade step tablet after development became 9.

Then, the first films of the materials using Laminate film A, Laminate film B, Laminate film C, Laminate film D, Laminate film E and Laminate film F and the G2-19 films of the materials using Laminate film G and Laminate film H were removed. The resulting materials were subjected to spray development by using a 1 % by weight sodium carbonate aqueous solution (30° C.) for 60 seconds to obtain resist patterns on the substrates.

In all of the laminate films, the number of remaining grades of the Stofer 21 grade step tablet was 9, and all of the laminate films had good resist images.

Then, a cupric chloride (copper (II) chloride) etching solution (2 mole/liter CuCl$_2$, a 2N—HCl aqueous solution, 50° C., spray pressure: 2 kgf/cm$^2$) was sprayed to the respective materials for 100 to 200 seconds to dissolve copper at the portions which were not protected by the resists. Further, the resist patterns were peeled (stripped) off by using a peeling (stripping) solution (a 3% by weight NaOH aqueous solution, 45° C., spray pressure: 2 kgf/cm$^2$) to prepare Printed wiring boards b in which copper lines were formed on the substrates.

When a laminate film is not conformed to a scratch on a substrate, there is a gap between a resist and the substrate. Therefore, an etching solution is penetrated into a crossing portion of the resist and the scratch to dissolve copper so that copper lines are not connected to cause breaking of wire. The depth ($\mu$m) of a scratch at which such breaking of wire started was defined as conformity to unevenness (as this value is larger, conformability is more excellent), and each depth of Printed wiring boards b was measured. The results are shown in Table 5.

(Preparation of Printed wiring boards c)

Epoxy substrates (thickness: 1.0 mm) each having one surface on which a copper foil having a thickness of 35 $\mu$m was laminated were pressed by using a press equipped with a mold having predetermined unevenness to obtain copper-clad laminated boards having a concave depth of 3 to 18 $\mu$m and a concave width of 300 to 2,000 $\mu$m.

Then, the copper-clad laminated boards obtained were heated to 80° C. By using a high temperature laminator (HLM-3000 manufactured by Hitachi Chemical Co., Ltd. was used), Laminate film A, Laminate film B, Laminate film C, Laminate film D, Laminate film E, Laminate film F, Laminate film G and Laminate film H prepared in Examples 1 to 6 and Comparative examples 1 and 2 were laminated on the above substrates, respectively, so that the photosensitive layers of all laminate films faced toward the substrates; the first film sides of Laminate film A, Laminate film B, Laminate film C, Laminate film D, Laminate film E and Laminate film F touched a lamination roll of the laminator; and the G2-19 film sides of Laminate film G and Laminate film H touched the lamination roll (the axis of the lamination roll was made parallel to the longitudinal direction of the concavities of the substrates). The lamination rate (speed) at this time was 1.5 m/min, the temperature of the lamination roll was 110° C., and the cylinder pressure of the lamination roll was 4 kgf/cm$^2$.

Then, after completion of lamination, the resulting materials were cooled to 23° C. On the first films of the materials using Laminate film A, Laminate film B, Laminate film C, Laminate film D, Laminate film E and Laminate film F and on the G2-19 films of the materials using Laminate film G and Laminate film H, anegative mask (line/space: 100 m/100 uim) and a Stofer 21 grade step tablet were closely contacted in a direction crossing perpendicularly to the longitudinal direction of the concavities of the substrates, respectively, and exposure was carried out by using an exposure machine (model: HMW-590, a mercury short arc lamp) manufactured by Orc Seisakusho Co. in such an energy amount that the number of remaining step grades of the Stofer 21 grade step tablet after development became 8.0.

Then, after the materials were left to stand at room temperature for 15 minutes, the first films of the materials using Laminate film A, Laminate film B, Laminate film C, Laminate film D, Laminate film E and Laminate film F and the G2-19 films of the materials using Laminate film G and Laminate film H were removed. The resulting materials were subjected to spray development by using a 1% by weight sodium carbonate aqueous solution (30° C.) for 50 seconds to obtain resist patterns on the substrates.

Then, a ferric chloride (iron (III) chloride) etching solution (Baume degree: 45°, 50° C., spray pressure: 2 kgf/cm$^2$) was sprayed to the respective materials for 80 seconds to dissolve copper at the portions which were not protected by the resists. Further, the resist patterns were peeled (stripped) off by using a peeling (stripping) solution (a 3% by weight NaOH aqueous solution, 45° C., spray pressure: 2 kgf/cm$^2$) to prepare Printed wiring boards c in which copper lines were formed on the substrates.

When a laminate film is not conformed to a concavity on a substrate, there is a gap between a resist and the substrate. Therefore, an etching solution is penetrated into a crossing portion of the resist and the concavity to dissolve copper so that copper lines are not connected to cause breaking of wire. The depth ($\mu$m) of a concavity at which such breaking of wire started was defined as conformability to wave (as this value is larger, conformability is more excellent), and each depth of Printed wiring boards c was measured. The results are shown in Table 4.

(Rate of breaking caused by peeling (stripping))

Substrates for which procedures until exposure were carried out according to the same method as in preparation of Printed wiring boards a were prepared. Then, tests of manually peeling (stripping) the first films of the materials using Laminate film A, Laminate film B, Laminate film C, Laminate film D, Laminate film E and Laminate film F and the G2-19 films of the materials using Laminate film G and Laminate film H (peeling (stripping) test) were carried out by peeling (stripping) 100 films per each laminate film. The rate of breaking a film which was peeled (stripped) off or tried to be peeled (stripped) off at the time of the peeling (stripping) test was defined as a rate of breaking caused by peeling (stripping) (as this value is smaller, peeling (stripping) property from a photosensitive layer is more excellent), and the rate of each material was measured. The results are shown in Table 4.

TABLE 4

|  | Example | | | | | | Comparative example | |
| --- | --- | --- | --- | --- | --- | --- | --- | --- |
|  | 7 | 8 | 9 | 10 | 11 | 12 | 3 | 4 |
| Laminated film | A | B | C | D | E | F | G | H |
| Resolution | 35 | 40 | 35 | 35 | 35 | 60 | 50 | 45 |
| Conformability to unevenness ($\mu$m) | 10 | 11 | 10 | 12 | 8.5 | 12 | 7 | 7 |
| Conformability to wave ($\mu$m) | 15 | 17 | 15 | 18 | 12 | 18 | 10 | 10 |
| Rate of breaking caused by peeling (%) | 0 | 20 | 0 | 0 | 14 | 21 | 0 | 0 |

In Examples 7 to 12 using the laminate films of the present invention (Laminate film A, Laminate film B, Laminate film C, Laminate film D, Laminate film E and Laminate film F), both of conformability to unevenness and conformability to wave were excellent as compared with those of Comparative examples 3 and 4 using Laminate film G and Laminate film H. Also, in Examples 7 to 10, resolution was excellent, and the rate of breaking caused by peeling (stripping) was small.

Utilizability in industry

The laminate film according to the first invention can provide a transfer layer which is favorably conformed to the surface unevenness of a target on which the transfer layer is to be laminated, improved resolution and the greatly improved production yield of a printed wiring board without increasing a production cost.

The laminate film according to the second invention exhibits the effects of the laminate film according to the first invention and further can provide improved sensitivity, crosslinking density, storage stability and resolution and a good peeling property (stripping property) of a first film from a photosensitive layer.

The laminate film according to the third invention exhibits the effects of the laminate film according to the first or the second invention and further can provide an excellent handling property.

The laminate film according to the fourth invention exhibits the effects of the laminate film according to the third invention and further can provide excellent operatability at the time of lamination.

The processes for preparing a printed wiring board according to the fifth and the sixth inventions can provide a transfer layer which is favorably conformed to the surface unevenness of a target on which the transfer layer is to be laminated, improved resolution and the greatly improved production yield of a printed wiring board without increasing a production cost.

What is claimed is:

1. A laminate film which comprises a photosensitive layer and a first film having a 5% elongation load in the longitudinal direction of the film per unit width at 80° C. of 8 to 30 g/mm and a breaking elongation in the longitudinal direction of the film per unit width of 50 to 1,000%.

2. The film according to claim 1, wherein the first film has a breaking extension of 100 to 1,000%.

3. The film according to claim 1, wherein the first film has a breaking extension of 100 to 800%.

4. The film according to claim 1, wherein the first film has a breaking extension of 150 to 600%.

5. The film according to claim 4, wherein the first film has a breaking extension of 150 to 400%.

6. The film according to claim 1, wherein the first film has an oxygen permeation amount of 400 ml/m$^2$·24h·atm or less, a water absorption rate of 5% or less and a haze of 10% or less.

7. The film according to claim 1, wherein the first film has an oxygen permeation amount of 0 to 200 ml/m$^2$·24h·atm, a water absorption rate of 0 to 1% and a haze of 0 to 6%.

8. The film according to claim 1, wherein the first film has an oxygen permeation amount of 0 to 100 ml/m$^2$·24h·atm, a water absorption rate of 0 to 0.5% and a haze of 0 to 4%.

9. The film according to claim 8, wherein the first film has a haze of 0 to 2%.

10. The film according to claim 1, wherein the first film has an Elemendorf tear strength of 4.5 kg/cm or more.

11. The film according to claim 1, wherein the first film has an Elemendorf tear strength of 5 kg/cm or more.

12. The film according to claim 1, wherein the first film has an Elemendorf tear strength of 7 kg/cm or more.

13. The film according to claim 1, wherein the first film has a refractive index of 1.55 or more.

14. The film according to claim 1, wherein the first film has a refractive index of 1.60 or more.

15. The film according to claim 1, wherein the first film has a refractive index of 1.65 or more.

16. The film according to claim 1, wherein the first film has a film thickness of 2 to 30 µm.

17. The film according to claim 1, wherein the first film has a film thickness of 5 to 20 µm.

18. The film according to claim 1, wherein the first film has a film thickness of 8 to 14 µm.

19. The film according to claim 1, wherein the photosensitive layer has a film thickness after drying of 3 to 100 µm.

20. The film according to claim 1, wherein said film comprises the photosensitive layer, the first film and further a second film at a side opposite to the side of the photosensitive layer where the first film is provided.

21. The film according to claim 20, wherein the adhesive force between the second film and the photosensitive layer is smaller than the adhesive force between the first film and the photosensitive layer.

22. The film according to claim 20, wherein the adhesive force between the second film and the photosensitive layer is 10 g/cm or less in terms of 180° peeling strength.

23. The film according to claim 20, wherein the second film has a film thickness of 5 to 200 µm.

24. The film according to claim 20, wherein the second film has a film thickness of 10 to 100 µm.

25. The film according to claim 20, wherein the second film has a film thickness of 10 to 50 µm.

26. A process for preparing a printed wiring board, which comprises laminating the film according to claim 1 on a substrate so that the photosensitive layer and the substrate are contacted with each other; and then subjecting a resulting material to exposure and development.

27. A process for preparing a printed wiring board, which comprises peeling the second film from the film according to claim 20, laminating the film on a substrate so that the photosensitive layer and the substrate are contacted with each other; and then subjecting a resulting material to exposure and development.

28. The film according to claim 1, wherein the photosensitive layer is adapted to be exposed to irradiation light, and wherein the first film is substantially transparent to the irradiation light.

29. The process according to claim 27, wherein said substrate includes a substrate of a printed wiring board.

30. The process according to claim 27, wherein the resulting material is subjected to exposure through the first film.

31. The process according to claim 26, wherein said substrate includes a substrate of a printed wiring board.

32. The process according to claim 26, wherein the resulting material is subjected to exposure through the first film.

33. A laminate film which comprises a photosensitive layer and a first film having a 5% elongation load in the longitudinal direction of the film per unit width at 80° C. of 4 to 90 g/mm and an oxygen permeation amount of 400 ml/m$^2$·24h·atm or less.

34. A laminate film which comprises a photosensitive layer and a first film having a 5% elongation load in the longitudinal direction of the film per unit width at 80° C. of 4 to 90 g/mm and an Elemendorf tear strength of 4.5 kg/cm or more.

35. A laminate film which comprises a photosensitive layer and a first film having a 5% elongation load in the longitudinal direction of the film per unit width at 80° C. of 4 to 90 g/mm and a refractive index of 1.55 or more.

* * * * *